Figure 1:
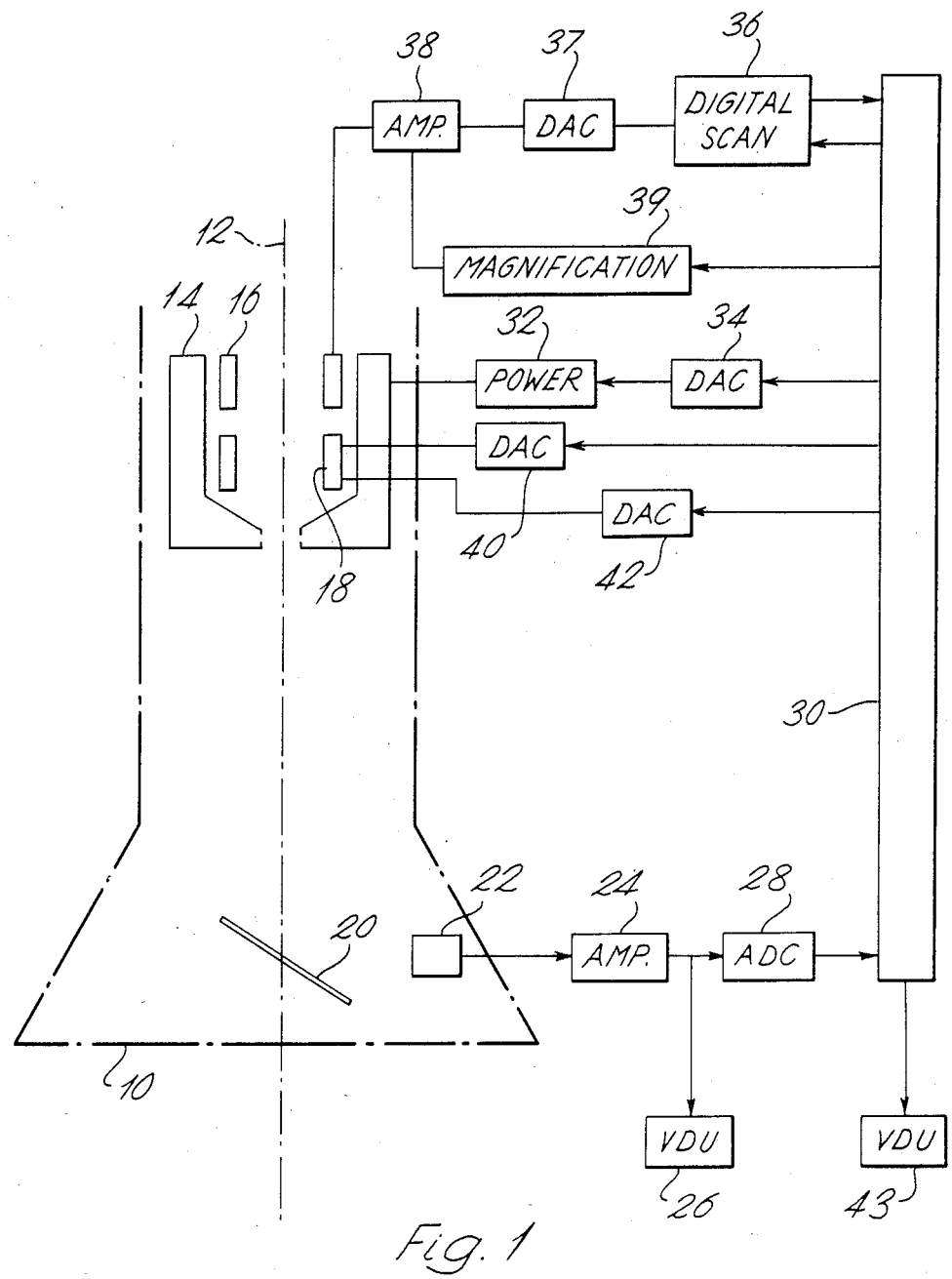

United States Patent [19]

Smith et al.

[11] Patent Number: 4,567,369

[45] Date of Patent: Jan. 28, 1986

[54] CORRECTION OF ASTIGMATISM IN ELECTRON BEAM INSTRUMENTS

[75] Inventors: Kenneth C. A. Smith, Cambridge, England; Stephen J. Erasmus, Mountain View, Calif.

[73] Assignee: National Research Development Corporation, London, England

[21] Appl. No.: 504,947

[22] Filed: Jun. 16, 1983

[30] Foreign Application Priority Data

Jun. 18, 1982 [GB] United Kingdom ............... 8217643

[51] Int. Cl.$^4$ .............................................. H01J 3/12
[52] U.S. Cl. ............................... 250/397; 250/396 R; 250/310; 250/311
[58] Field of Search ............... 250/397, 396, 310, 311; 358/169; 382/50, 51

[56] References Cited

U.S. PATENT DOCUMENTS 4,038,543 7/1977 Krisch et al. ...................... 250/311
4,180,738 12/1979 Smith et al. .
4,231,065 10/1980 Fitch et al. ......................... 358/169

FOREIGN PATENT DOCUMENTS 0030347 3/1982 European Pat. Off. .
1329559 9/1973 United Kingdom .
2059120 4/1981 United Kingdom .
2002547 1/1982 United Kingdom .

OTHER PUBLICATIONS

Harris, "Constant Variance Enhancement...", Applied Optics, vol. 16, No. 5, May 1977, pp. 1268-1271.

Primary Examiner—Alfred E. Smith
Assistant Examiner—Jack I. Berman
Attorney, Agent, or Firm—Cushman, Darby & Cushman

[57] ABSTRACT

An electron beam instrument having an objective lens coil 14 and stigmator coils 18 has its astigmatism corrected for by measurement of the contrast in the final image. The currents through the objective lens and the stigmator coils are adjusted in sequence iteratively to optimize the contrast.

The optimum contrast may be either a maximum contrast or a minimum contrast depending on the nature of the instrument and its mode of operation. Measurement of contrast may be made by measuring the magnitudes of successive points of an image and calculating the variance. Alternatively two measurements of magnitude at each point of an image may be made and the covariance calculated.

11 Claims, 4 Drawing Figures

CORRECTION OF ASTIGMATISM IN ELECTRON BEAM INSTRUMENTS

This invention relates to methods and apparatus for the correction of astigmatism in the focusing system of electron microscopes and similar instruments. It has application in scanning electron microscopes (SEM) as well as in conventional transmission electron microscopes (CTEM), scanning transmission electron microscopes (STEM) and electron beam microfabrication instruments.

Astigmatism is a defect in a focusing system which results in failure to achieve precise focus at a point in the intended focal plane. Instead line focus positions occur above and below the plane and the axes of these line foci are mutually perpendicular. To correct the defect two auxiliary coils known as stigmator coils are provided, these coils being respectively known as the X and Y stigmator coils. Astigmatism can be controlled by manual adjustment of the currents through the coils but to be effective, an operator requires considerable experience and time and re-adjustment may be necessary whenever the focus conditions drift as a result of thermal or electrical changes.

In UK Pat. No. 2002547 there is described a method and apparatus for the investigation and correction of astigmatism in the focusing system of an electron microscope. This method and apparatus, although satisfactory, is complex in operation.

It is an object of the invention to provide a method for correcting astigmatism in an electron microscope which is automatic, effective and simple to operate.

According to the invention in one aspect a method of correcting astigmatism in an electron beam instrument comprises the steps of adjusting the focusing of the objective lens of the instrument to give optimum value of contrast of the image and then adjusting the two stigmators in succession for optimum contrast.

Preferably the above described steps are repeated at least once and preferably more than once in order to improve the accuracy of the result.

In the case of an SEM, the optimum contrast is the maximum contrast. However, in a CTEM or a STEM the optimum contrast is a minimum contrast when examining phase contrast specimens, but is otherwise the maximum contrast.

In carrying out the invention the optimum contrast may be achieved by calculating the variance of the image or in one preferred embodiment covariance of a pair of images taken under the same focus conditions.

Figure 2:
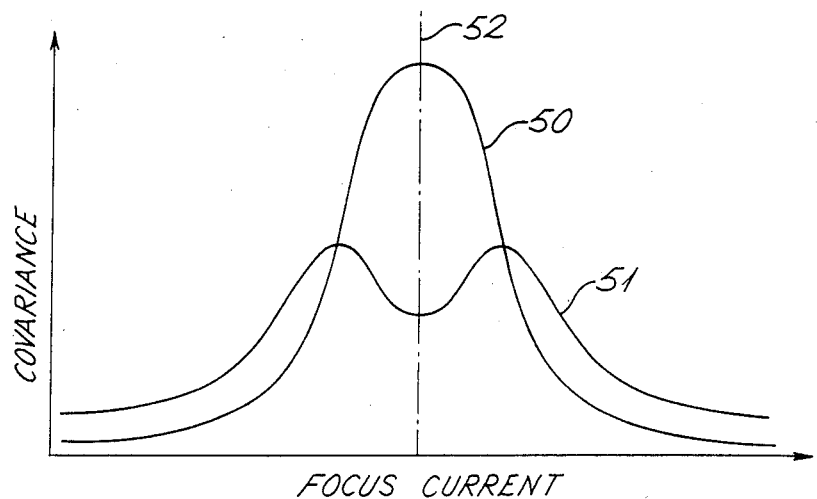
Figure 3A:
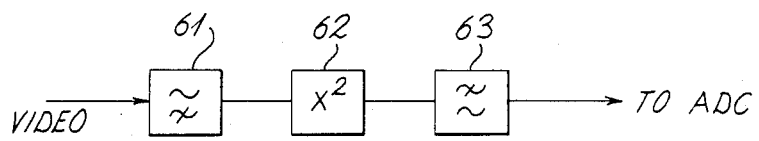
Figure 3B:
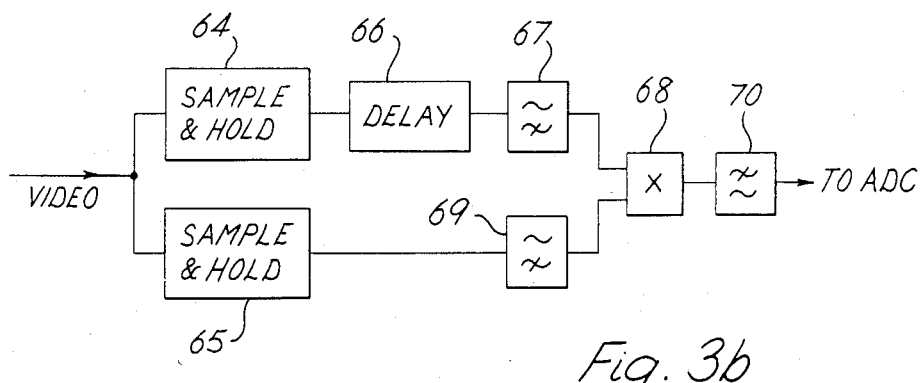

In order that the invention may be more fully understood, reference will now be made to the drawings accompanying this specification in which:

FIG. 1 illustrates a scanning electron microscope (SEM) and associated apparatus for carrying out the invention, FIG. 2 illustrates a typical curve of covariance (or contrast) against focus current, and FIG. 3a and FIG. 3b show circuit diagrams for calculating variance and covariance.

Referring now to FIG. 1, there is shown therein an SEM 10 having conventional electron-optical facilities. No modification to these facilities is required. In SEM 10 an electron beam is projected along an axis 12 and passes through the magnetic field of an objective lens 14, scan coils 16 and stigmator coils 18 to bombard the surface of a specimen 20. Electrons reflected from the surface of specimen 20 are detected by a detector 22 which provides an output signal representative of the structure of the specimen at each successive point in the scanning pattern as controlled by electric currents through scan coils 16. The output signal from detector 22 is amplified in an amplifier 24 and displayed in a visual display unit 26 the scanning of which is synchronised with the scanning of the specimen by the electron beam. Stigmator coils 18 are arranged to produce in a diametrical plane a field pattern which compensates for any asymmetry in the focusing of the beam. The pattern is required to be orientated to an appropriate angle to correct for the astigmatism and this may be achieved by physically rotating stigmator coils 18 or more commonly by providing two fixed sets of coils known as the X and Y stigmator coils and adjusting the magnitudes of the currents through them.

In order to provide automatic astigmatism correction a calculating device 30 is provided. This device is fed with the output from detector 22 after passing through an analogue-to-digital converter (ADC) 28. The calculating device 30 controls the current to objective lens 14 via a digital-to-analogue converter (DAC) 34 feeding an electrical power supply 32 to lens coils 14. Scan coils 16 are controlled from a scan generator 36 which operates in conjunction with device 30 and feeds an amplifier 38 supplying currents to scan coils 16 through a digital-to-analogue converter (DAC) 37. The area of the specimen to be scanned is determined by the level of excitation of the scanning coils 16. An appropriate magnification is selected by unit 39 which controls amplifier 38. Astigmatism correction signals are applied to the X and Y stigmator coils 18 each through respective digital-to-analogue converters (DACs) 40 and 42 as provided by the calculating device 30 in a manner to be described below.

In use of the microscope the specimen is scanned with a preliminary value of objective lens coil currents. At each successive point in the scan two successive samples of the magnitude of the output as derived from ADC 28 are taken for the purpose of measuring the covariance of a pair of images. The pictures corresponding to the two samples at each point will be identical except for the noise which will be different in the two pictures. Let the magnitudes of the two samples at a point having coordinates i, j be $x_{ij}$ and $y_{ij}$ respectively. Then as scanning proceeds the respective running sums of the two samples, namely $\Sigma x_{ij}$ and $\Sigma y_{ij}$ are calculated. Additionally the running sum of the products of the two samples, namely $\Sigma x_{ij} y_{ij}$ is calculated.

At the end of the scan the values $\overline{X}$ and $\overline{Y}$ are calculated where $$\overline{X} = \frac{1}{N} \Sigma x_{ij}$$

and $$\overline{Y} = \frac{1}{N} \Sigma y_{ij}$$

then $$\text{cov}(X, Y) = \frac{1}{N} \Sigma x_{ij} y_{ij} - \overline{XY}$$

where N is the number of points measured in each image.

After one scan the focus current is incremented and the scan repeated to obtain a new value for covariance. Calculating device 30 is programmed to increment the focus to a value at which the covariance is maximised. This is the position of best focus before any adjustment to allow for astigmatism. The relationship between focus current and covariance is illustrated in FIG. 2.

FIG. 2 shows two curves 50 and 51 of the relationship between covariance and focus current. Curve 50 shows such relationship when there is a small amount of astigmatism. In these circumstances there is a single clearly defined peak and the focus current is optimised to the value of this peak. However, where large amounts of astigmatism are present the curve is as shown at 51 and there are two peaks with the optimum value for focus current occurring along the axis of symmetry 52 between the two peaks. When such a double peak is obtained the focus current is set to the value indicated by the position of the axis of symmetry 52.

Where the system is applied to transmission electron microscopes the shape of the covariance curve for minimum covariance depends on the initial value of focus and astigmatism.

Scanning is now repeated with the optimum value of focus that has been obtained but instead with the current through one of the stigmator coils 18, say the X stigmator coil, now varied to obtain the best covariance value. Having achieved this the optimum value of focus current and X stigmator current is held and the scanning is repeated to obtain the optimum value of Y stigmator coil current. The relationship between covariance and stigmator current is similar to the relationship between covariance and focus current shown in FIG. 2. Curve 50 or 51 will apply and the best value of stigmator current is obtained in like manner to the best value of focus current.

After achieving a first optimum value for the focus current and X and Y stigmator coil currents respectively, a further scanning operation is now carried out to obtain a second optimum value for the focus current in the presence of the already obtained astigmatism correction. Further steps involve reoptimising the X and Y stigmator coil currents a further time.

The operation of repeatedly reoptimising the focus current and the X and Y stigmator coil currents in succession may be repeated as often as thought desirable or until no appreciable change in values is obtained. The final optimum value of stigmator coil currents will then be the best obtainable and viewing and recording of the specimen can then proceed.

The calculation described above measures the covariance of two successive images of a picture point in specimen 20. It is possible to simplify this calculation by calculating the variance of a single image. In calculating variance the term $\overline{X}$ is derived as before but in place of the running sum of the products of two samples there is calculated the running sum of the square of the value obtained at each picture point, namely the term $\Sigma x_{ij}^2$. At the end of the scan the variance var(X) is calculated where $$\text{var}(X) = \frac{1}{N} \Sigma x_{ij}^2 - \overline{X}^2$$

The invention is applicable not only to SEMs but also to transmission electron microscopes in which the electron beam passes through a specimen and produces an image on a fluorescent screen which is viewed by means of a low level light TV camera.

The calculation of covariance can, with some types of TV camera, be carried out as described above. With other types of camera a digital frame store is required which is capable of holding at least one complete image from the fluorescent screen. The covariance calculation is carried out using both the digital information held in the frame store and the digitised information obtained directly from the camera. In the case of the variance calculation it may be sufficient to utilise the information received directly from the camera in which case storage of digital information is not required, although it may be convenient.

Where a transmission electron microscope is being used then in certain types of experiment the optimum focus is one in which the transmission is a minimum. The calculation for such minimum transmission proceeds in like manner to the calculation of maximum contrast except that the focus currents and the stigmator currents are incremented towards a minimum value of covariance or variance.

In the arrangement described with reference to FIG. 1 a digital method for calculating variance or covariance is used. It is possible instead to use an analogue method for either of these calculations and suitable circuits for this purpose are illustrated in FIG. 3. In FIG. 3 the video signal from amplifier 24 is fed to either the circuit of FIG. 3a for the calculation of variance or the circuit of FIG. 3b for the calculation of covariance. The output from one or other of the respective circuits is then applied to the analogue-to-digital converter 28 and thence to the calculating device 30 for control of the focus and stigmator currents of the microscope as before.

In the circuit of FIG. 3a for the calculation of variance the video signal is passed firstly to a high pass filter 61 and thence to a squaring circuit 62 and a low pass filter 63. For the calculation of covariance as shown in FIG. 3b the video signal from amplifier 24 is applied to two parallel sample-and-hold circuits 64 and 65. The output from circuit 64 is passed through a delay circuit 66 and high pass filter 67 to a multiplier 68. The output from sample-and-hold circuit 65 is passed through a high pass filter 69 similar to filter 67 and thence to the multiplier 68. The output from multiplier 68 is fed through a low pass filter 70 to the ADC circuit 28.

Both the high pass filters and the low pass filters shown in FIG. 3a and FIG. 3b have corner frequencies which are well below the frame frequency of camera 22. The settling time of the analogue circuits of FIG. 3a or FIG. 3b is several frames and to reduce the settling time to two frames the low pass filters may comprise boxcar circuits and the high pass filters circuits of the form (1-boxcar). If boxcar circuits are used they should be gated off during the line flyback times.

We claim:

1. A method of correcting astigmatism in an electron beam instrument which is provided with an objective lens coil and stigmator coils comprising carrying out the following sequence of steps, namely: measuring the magnitudes of each of all of the sample points of an entire image and calculating the variance of the said measured magnitudes, adjusting the focusing of the objective lens of the instrument to give an optimum value of variance, and then adjusting the stigmator coils in succession for optimum variance.

2. A method as claimed in claim 1 in which the said sequence of steps is repeated.

3. A method as claimed in claim 1 in which the said sequence of steps is repeated a plurality of times.

4. A method of correcting astigmatism in an electron beam instrument which is provided with an objective lens coil and stigmator coils comprising carrying out the following sequence of steps namely: measuring the magnitudes of each of all of the sample points of an entire image at two different instants of time and calculating the covariance of said measured magnitudes, adjusting the focusing of the objective lens coil for an optimum value of covariance, and then adjusting the stigmator coils in succession to achieve an optimum value of covariance.

5. A method as claimed in claim 1 in which the optimum value of variance corresponds to the maximum contrast.

6. A method as claimed in claim 1 in which the optimum value of variance corresponds to the minimum contrast.

7. An electron beam instrument including an objective lens coil and two stigmator coils, means for measuring the contrast of the image produced by the instrument, said means comprising means for measuring the magnitudes of each of all of the sample points of the entire image and means for calculating the variance of the said measured magnitudes, and means for adjusting the currents through the objective lens coil and through each of the stigmator coils in sequence in a manner to optimise the measured value of the contrast.

8. The instrument as claimed in claim 7 in which the said means for adjusting the coils operates iteratively.

9. An electron beam instrument including an objective lens coil and two stigmator coils, means for measuring the contrast of the image comprising means for measuring the magnitudes of each of all of the sample points of the entire image at two different instants of time and means for calculating the covariance of said measured magnitudes, and means for adjusting the currents through the objective lens coil and through each of the stigmator coils in sequence in a manner to optimise the measured value of the contrast.

10. The instrument as claimed in any one of claims 7 to 9 in which the optimum contrast is the maximum contrast.

11. The instrument as claimed in any one of claims 7 to 9 in which the optimum contrast is the minimum contrast.

* * * * *